United States Patent [19]
Shimizu

[11] Patent Number: 5,566,118
[45] Date of Patent: Oct. 15, 1996

[54] DYNAMIC SEMICONDUCTOR MEMORY DEVICE WITH SENSE AMPLIFIERS AS CACHE MEMORIES

[75] Inventor: Tamio Shimizu, Tokyo, Japan

[73] Assignee: NEC Corporation, Tokyo, Japan

[21] Appl. No.: 549,076

[22] Filed: Oct. 27, 1995

[30] Foreign Application Priority Data

Oct. 28, 1994 [JP] Japan .................................. 6-265595

[51] Int. Cl.$^6$ ..................................................... G11C 8/00
[52] U.S. Cl. ...................................... 365/222; 365/230.03
[58] Field of Search .................................... 365/222, 230.03

[56] References Cited

U.S. PATENT DOCUMENTS 5,471,430  11/1995  Sawada et al. ........................ 365/222

Primary Examiner—David C. Nelms
Assistant Examiner—Trong Phan
Attorney, Agent, or Firm—Sughrue, Mion, Zinn, Macpeak & Seas

[57] ABSTRACT

In a dynamic DRAM device including a plurality of memory cell blocks associated with sense amplifier arrays as cache memories, and registers for storing addresses of the memory cell blocks to indicate the contents of the sense amplifiers, a refresh address for a self-refresh mode is sequentially generated to perform a refresh operation upon the memoty cell blocks. When the refresh address coincides with a predetermined value, data of the memory cell blocks is read by using an address of one of the registers and is restored in a corresponding sense amplifer array.

9 Claims, 10 Drawing Sheets

Fig. 5A $\overline{SR}$
Fig. 5B REF
Fig. 5C SRE
Fig. 5D RL

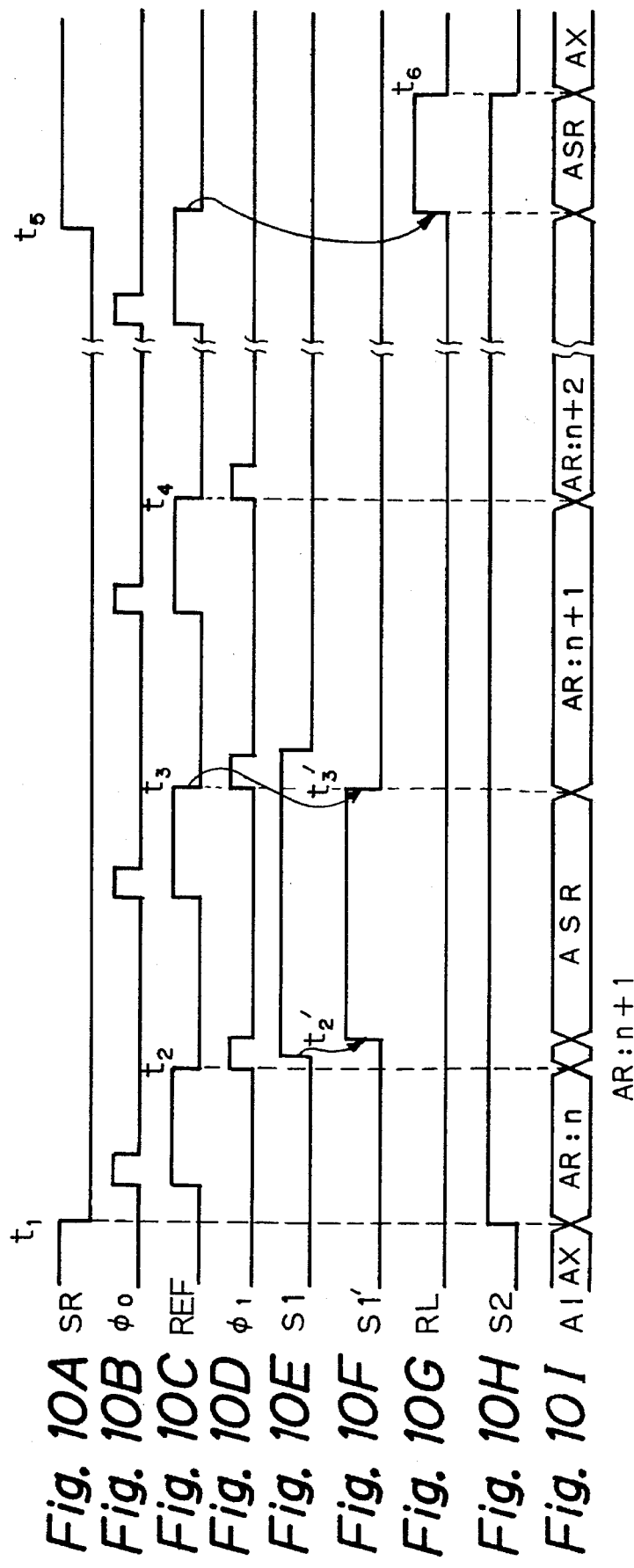

DYNAMIC SEMICONDUCTOR MEMORY DEVICE WITH SENSE AMPLIFIERS AS CACHE MEMORIES

BACKGROUND OF THE INVENTION

1. Field of the Invention

The present invention relates to a semiconductor memory device, and more particularly, to a dynamic random access memory (DRAM) device with sense amplifiers as cache memories.

2. Description of the Related Art

Generally, in a low speed, large capacity main storage unit formed by DRAMs, in order to substantially increase access speed, a high speed, small capacity cache memory formed by bipolar transistors is incorporated into the main storage unit or provided externally for the main storage unit. However, since such a cache memory is very expensive, various cache substitution means have been suggested.

A prior art DRAM device uses sense amplifiers as a cache substitution means. That is, generally, if a memory section is divided into a plurality of memory cell blocks, each of the blocks is associated with a sense amplifier array which also has a storage function for the last accessed data. Therefore, the sense amplifier array is a cache substitution means, and can serve as a cache memory.

In order to make the sense amplifier arrays serve as cache memories, registers are provided for storing row addresses which were used for accessing the memory cell blocks, because the sense amplifier arrays store data finally accessed. This will be explained later in detail.

In the above-described DRAM device, however, if a self-refresh mode operation is carried out for automatically refreshing all the memory cells to maintain the data therein, all the cache data stored in the sense amplifier arrays are erased, thus reducing the performance of the cache memories.

Note that, if data of one of the memory cell blocks is read by using data of one of the registers and is restored in the corresponding sense amplifier array every time one refresh operation of the self-refresh mode is completed, the power dissipation is increased. Further, if data of all the memory cell blocks are read by using data of all the registers and are restored in all the sense amplifier arrays every time the self-refresh mode is completed, a time required for ending the refresh mode is increased.

SUMMARY OF THE INVENTION

It is an object of the present invention to improve the performance of a DRAM device associated with sense amplifiers as cache memories without increasing the power dissipation.

Another object is to improve the performance of a DRAM device associated with sense amplifiers as cache memories without increasing the time required for ending a self-refresh mode.

According to the present invention, in a dynmic DRAM device including a plurality of memory cell blocks associated with sense amplifier arrays as cache memories, and registers for storing addresses of the memory cell blocks to indicate the contents of the sense amplifiers, a refresh address for a self-refresh mode is sequentially generated to perform a refresh operation upon the memory cell blocks. When the refresh address coincides with a predetermined value, data of the memory cell blocks is read by using an address of one of the registers and is restored in a corresponding sense amplifier array.

Also, when the self-refresh mode is ended, data of the memory cell blocks is read by using an address of one of the registers designated by the refresh address and is restored in a corresponding sense amplifier array.

BRIEF DESCRIPTION OF THE DRAWINGS

The present invention will be more clearly understood from the description as set forth below, in comparison with the prior art, with reference to the accompanying drawings, wherein:

FIGS. 10A through 10I are diagrams showing the operation of the control circuit of FIG. 9.

DESCRIPTION OF THE PREFERRED EMBODIMENTS

Before the description of the preferred embodiments, a prior art DRAM device will be explained with reference to FIGS. 1, 2 and 3.

Figure 1:
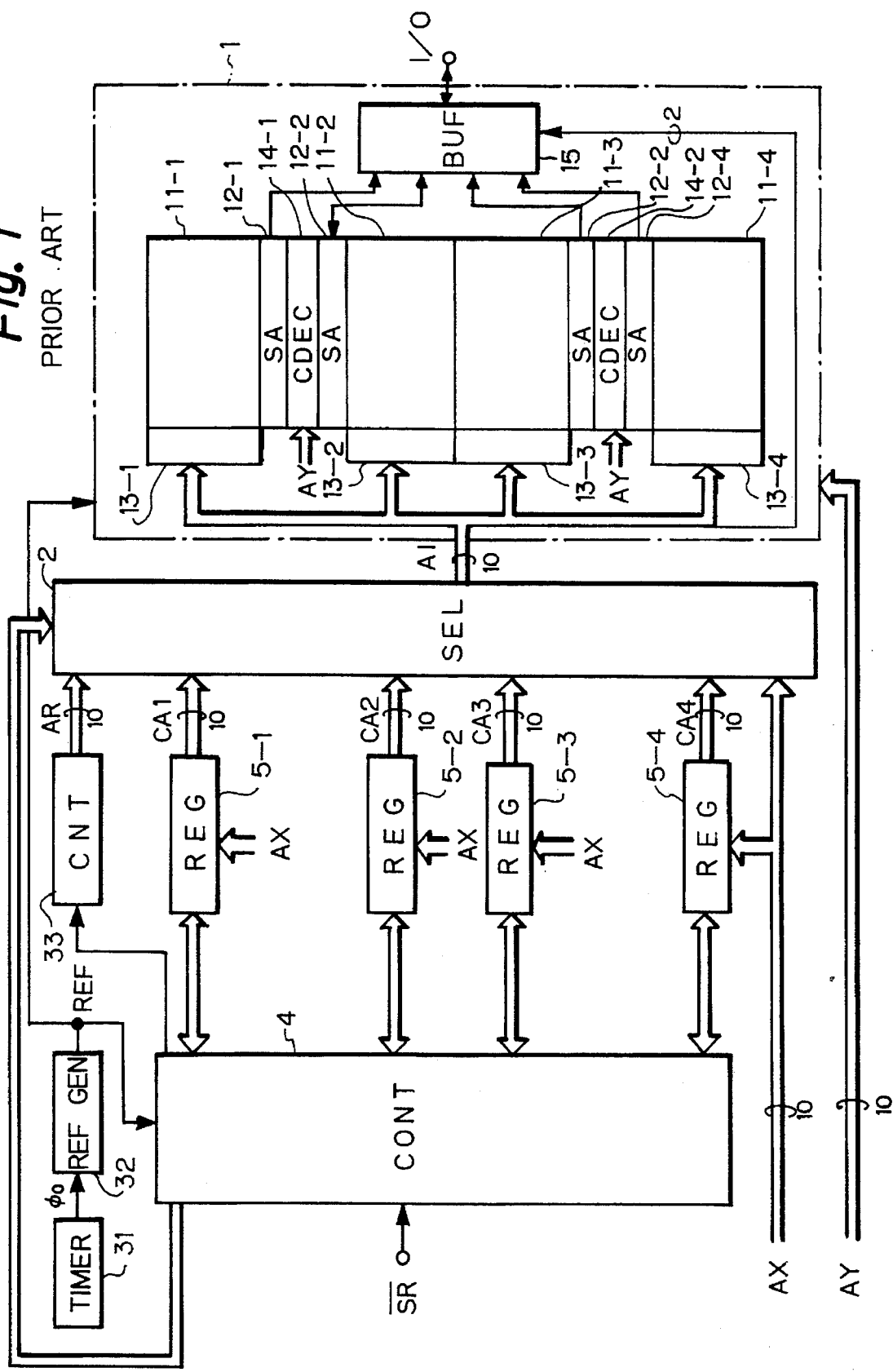
FIG. 1 is a block circuit diagram illustrating a prior art DRAM device.

In FIG. 1, a memory section 1 includes four memory cell blocks 11-1, 11-2, 11-3 and 11-4 associated with sense amplifier arrays 12-1, 12-2, 12-3 and 12-4, respectively. Row decoders 13-1, 13-2, 13-3 and 13-4 receive a first part of a row address signal AI to select one row of the memory cell blocks 11-1, 11-2, 11-3 and 11-4. For example, if the row address signal AI is formed by ten bits $AI_0, AI, \ldots, AI_9$, the first part thereof is formed by eight bits $AI_0, AI_1, \ldots, AI_7$. Also, column decoders 14-1 and 14-2 receive an external column address signal AY formed by ten bits $AY_0, AY_1, \ldots, AY_9$ to select one column of the sense amplifier arrays 12-1, 12-2, 12-3 and 12-4, i.e., one column of the memory cell blocks 11-1, 11-2, 11-3 and 11-4. Further, an input/output buffer 15 receives a second part of the row address signal AI, i.e., the bits $AI_8$ and $AI_9$ to select one of the sense amplifier arrays 12-1, 12-2, 12-3 and 12-4 and connect it to an input/output terminal I/O.

In a read/write access mode, when cache addresses are miss-hit, a selector 2 selects an external row address signal AX as the row address signal AI.

Reference numeral 31 designates a timer for generating a timer signal $\phi 0$ at every time period, and a refresh signal generating circuit 32 receives the timer signal $\phi 0$ to generate a refresh signal REF.

Upon receipt of the refresh signal REF, a control circuit 4 increments a counter 33 to generate a refresh address signal AR. In a refresh mode, the selector 2 selects the refresh address signal AR as the row address signal AI.

In FIG. 1, the sense amplifier arrays 12-1, 12-2, 12-3 and 12-4 serve as cache memories. In order to store cache addresses, registers 5-1, 5-2, 5-3 and 5-4 are provided for the sense amplifier arrays 12-1, 12-2, 12-3 and 12-4, i.e., the memory cell blocks 11-1, 11-2, 11-3 and 11-4, respectively. That is, in a read/write access mode, when one of the cache addresses CA1, CA2, CA3 and CA4 stored in the registers 5-1, 5-2, 5-3 and 5-4 is hit, the selector 2 selects one of the cache addresses CA1, CA2, CA3 and CA4 as the row address signal AI.

An access operation of the control circuit 4 will be explained next with reference to FIG. 2.

At step 200, the Control circuit 4 is in a stand-by state. When the control circuit 4 receives an access request signal such as a row address strobe signal (not shown), the control is transferred to an access mode step 201.

Next, at step 202, the control circuit 4 determines whether the control is in a read/write access mode or in a refresh mode. Note that a refresh execution flag is set at certain time periods, and therefore, even in a read/write access mode, a refresh operation is carried out. If the control is in a read/write access mode, the control proceeds to steps 203 through 206. If the control is in a refresh mode, the control proceeds to step 211.

At steps 203 to 206, it is determined whether or not the external row address signal AX is the same as one of the cache addresses CA1, CA2, CA3 and CA4 of the registers 5-1, 5-2, 5-3 and 5-4. If AX=CA1, CA2, CA3 or CA4, one of the cache memories is hit, so that the control proceeds directly to step 209. Otherwise, the cache memories are miss-hit, so that the control proceeds to steps 207 and 208.

At step 207, the control circuit 4 causes the selector 2 to select the external row address signal AX. As a result, the row decoders 13-1, 13-2, 13-3 and 13-4 select one row by the eight bits of the external row address signal AX (=AI). Then, at step 208, the control circuit 4 stores the miss-hit row address AX in a corresponding one of the registers 5-1, 5-2, 5-3 and 5-4.

At step 209, a column access is carried out by using the external column address signal AY, that is, the column decoders 14-1 and 14-2 select one column of the sense amplifier arrays 12-1, 12-2, 12-3 and 12-4 and connect it to the input/output buffer 15. Then, at step 210, the input/output buffer 15 selects one of the sense amplifier arrays 12-1, 12-2, 12-3 and 12-4 in accordance with the two bits of the row address signal AI. Then, the control returns to step 200.

On the other hand, at step 211, a refresh operation is carried out by the refresh address signal AR to refresh one row of the memory cell blocks 11-1, 11-2, 11-3 and 11-4. Then, the content of the counter 33 is incremented by +1. In this case, data of one of the cache memories, i.e., the sense amplifier arrays 12-1, 12-2, 12-3 and 12-4 is erased. Therefore, at step 212, data of one row of the memory cell blocks 1i-1, 11-2, 11-3 and 11-4 is read in accordance with the cache address CA1, CA2, CA3 or CA4 stored in the register 51-1, 51-2, 51-3 or 51-4 designated by the refresh address signal AR, and is restored in a corresponding one of the sense amplifier arrays 12-1, 12-2, 12-3 and 12-4. Then, the control returns to step 200.

Figure 2:
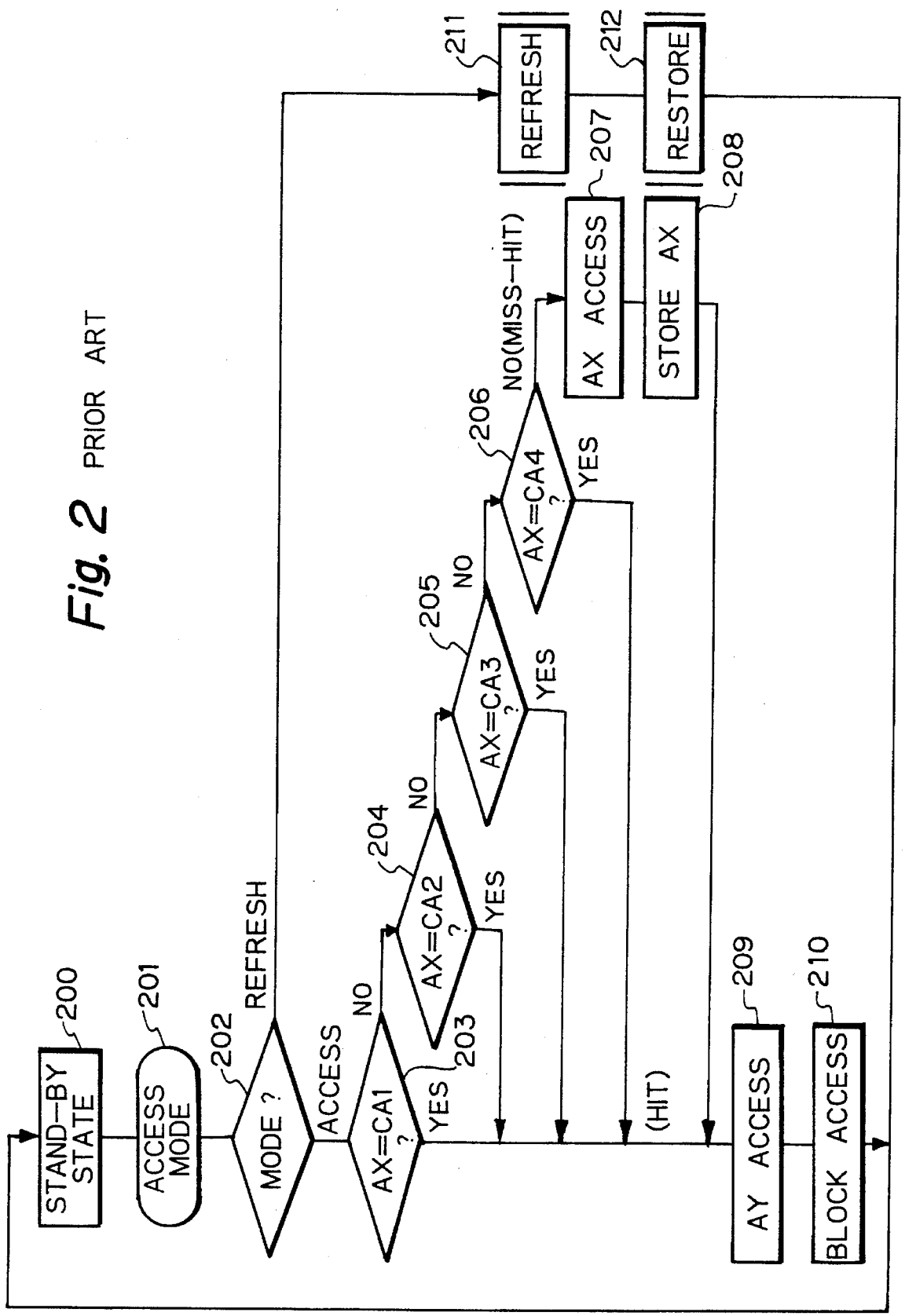
FIGS. 2 and 3 are flowcharts showing the operation of the control circuit of FIG. 1.

Thus, in FIG. 2, the erase of of cache data can be avoided.

A self-refresh operation of the control circuit 4 will be explained with next reference to FIG. 3.

When the control circuit 4 receives a self-refresh signal $\overline{SR}$ (="0") from the exterior, the control is transferred from a stand-by state step 200 to a self-refresh mode step 301.

Next, at step 302, it is determined whether or not the refresh signal REF is high (="1"). As a result, only when REF ="1", does the control proceed to steps 303 and 304. Otherwise, the control proceeds directly to step 305.

At step 303, a refresh operation is carried out by the refresh row address signal AR to refresh one row of the memory cell blocks 11-1, 11-2, 11-3 and 11-4. Then, at step 304, the control circuit 4 increments the content of the counter 33 by +1 for the next refresh operation.

The control at steps 302 to 304 is repeated by step 305 until the self-refresh signal SR becomes "1".

Figure 3:
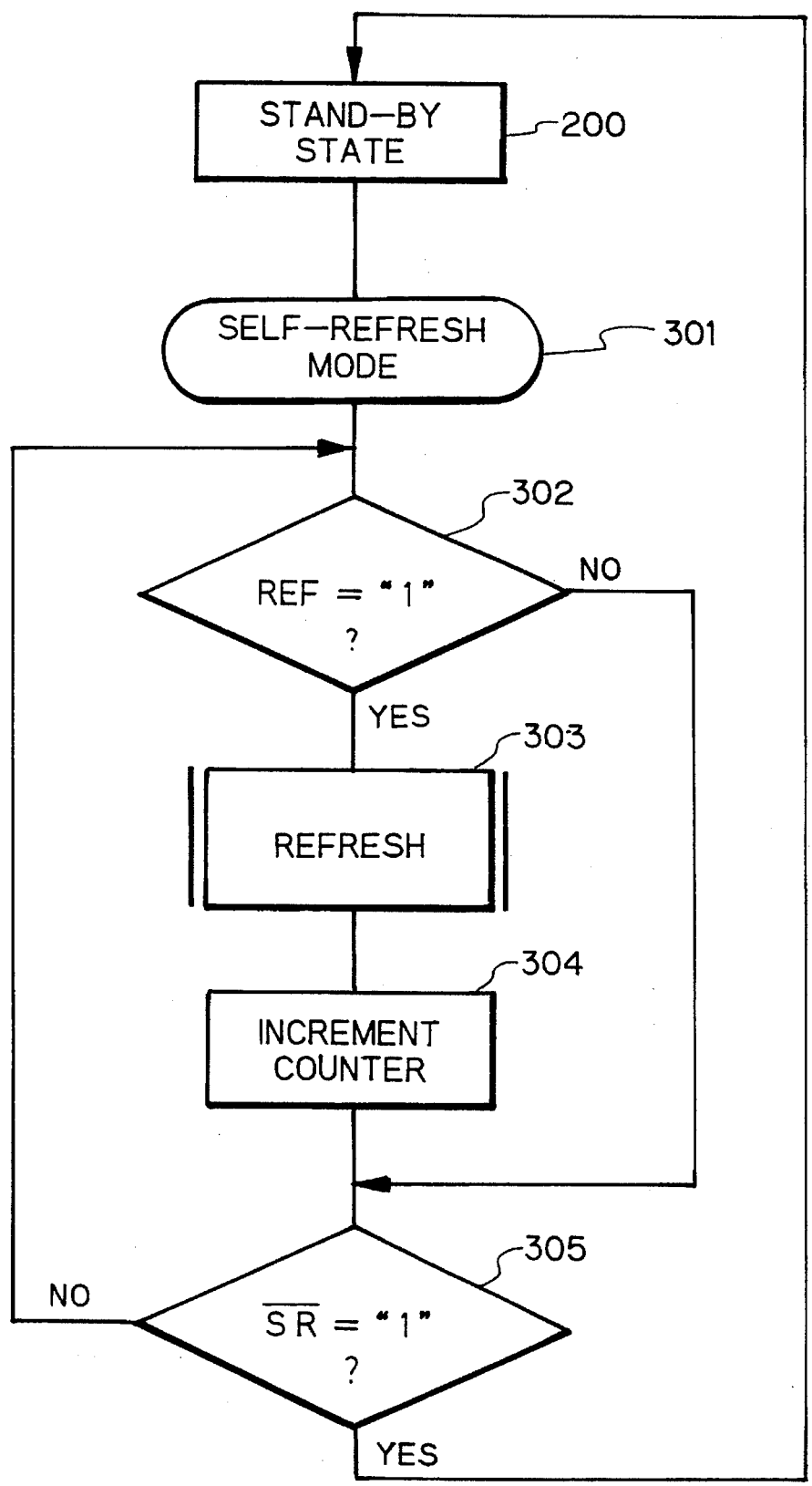

Thus, in FIG. 3, the erasing of cache data cannot be avoided.

Note that, if data of one of the memory cell blocks 11-1, 11-2, 11-3 and 11-4 is read by using data of one of the registers 5-1, 5-2, 5-3 and 5-4 and is restored in the corresponding sense amplifier array every time one refresh operation at step 303 is completed, the power dissipation is increased. Further, if data of all the memory cell blocks 11-1, 11-2, 11-3 and 11-4 are read by using data of all the registers and are restored in all the sense amplifier arrays 12-1, 12-2, 12-3 and 12-4 every time the self-refresh mode at step 305 is completed, a time required for ending the refresh mode is increased.

Figure 4:
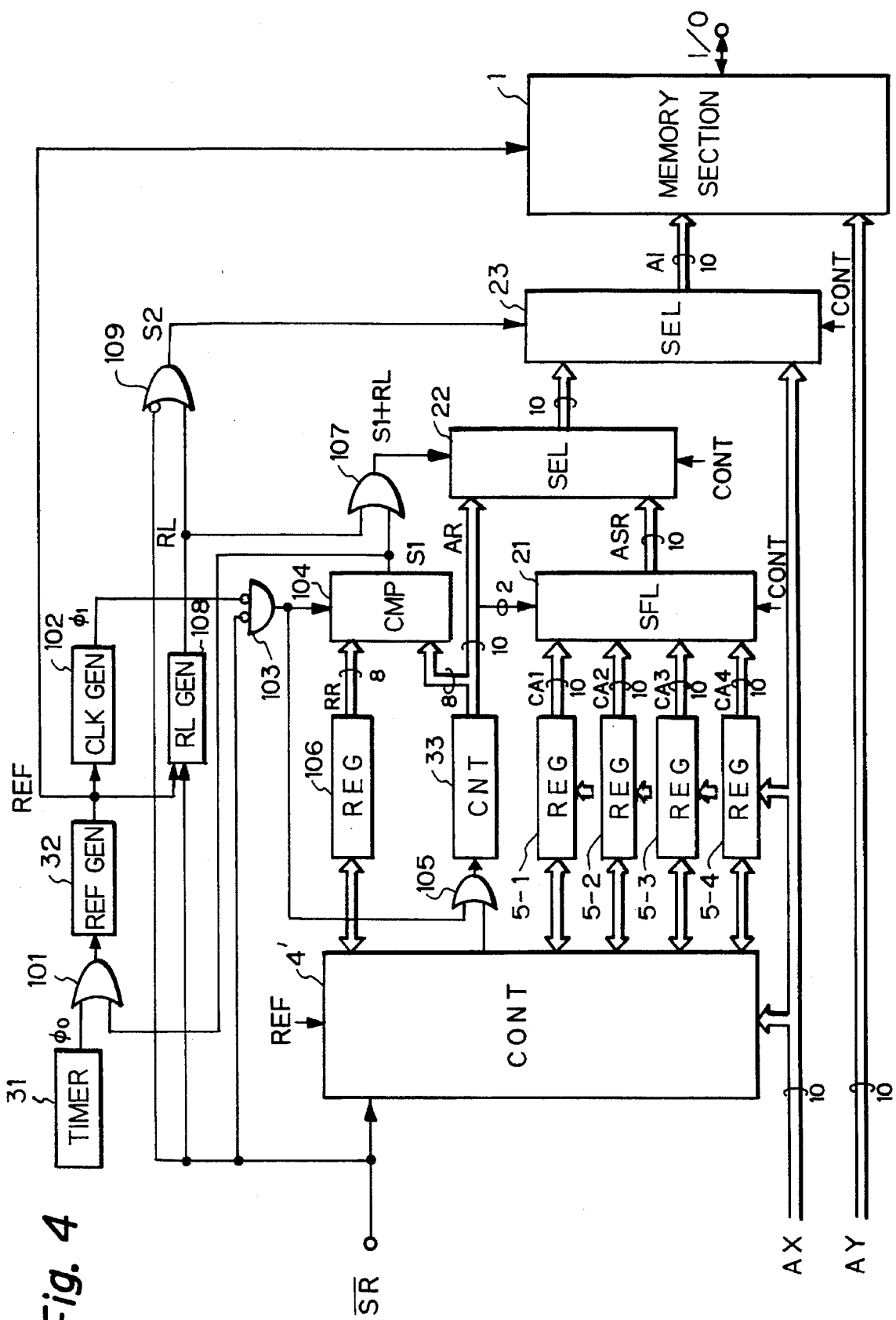
FIG. 4 is a block circuit diagram illustrating a first embodiment of the semiconductor device according to the present invention.

In FIG. 4, which illustrates a first embodiment of the present invention, selectors 21, 22 and 23 are provided instead of the selector 2 of FIG. 1. The selector 21 selects one of the cache addresses CA1, CA2, CA3 and CA4 of the registers 5-1, 5-2, 5-3 and 5-4 in accordance of the two upper bits of the refresh address signal AR. Also, the selector 22 selects either the refresh address signal AR or an output address ASR of the selector 21. Further, the selector 23 selects either an output address of the selector 22 or the external row address signal AX.

Also, in FIG. 4, an OR circuit 101 is inserted between the timer 31 and the refresh signal generating circuit 32. Also, provided at the output of the refresh signal generating circuit 102 is a clock signal generating circuit 102 for generating a clock signal ø1.

The clock signal ø1 is supplied via a gate circuit 103 to a comparator 104, and is further supplied via an OR circuit 105 to the counter 33. The comparator 104 compares the eight lower bits of the refresh address signal AR with a definite eight-bit value RR such as 00000000 stored in a register 106. When the lower bits of the refresh address signal AR coincide with the definite value RR, an output signal S1 of the comparator 104 is supplied via an OR circuit 107 to the selector 22, and as a result, the selector 22 selects the output address ASR of the selector 21.

Figure 5:
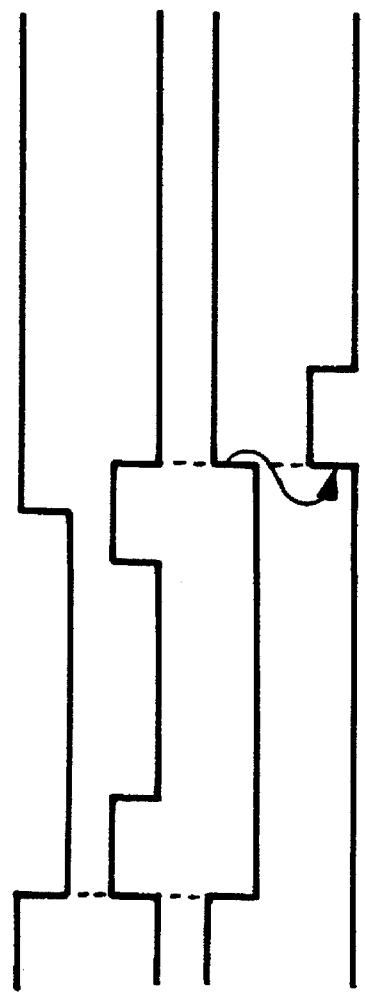
FIGS. 5A through 5D are timing diagrams showing the operation of the RL signal generating circuit of FIG. 4.

The selector 22 is also controlled by a release (RL) generating circuit 108 which generates a release signal RL when the self-refresh signal $\overline{SR}$ is completed. The release generating circuit 108 receives the self-refresh signal $\overline{SR}$ as shown in FIG. 5A and the refresh signal REF as shown in FIG. 5B to generate an AND logic signal SRE therebetween as shown in FIG. 5C. Then, the RL signal generating circuit 108 generates the release signal RL in response to a rising edge of the AND logic signal SRE.

Further, in FIG. 4, a gate circuit 109 receives the self-refresh signal $\overline{SR}$ and the RL signal to generate an output signal S2. The output signal S2 is supplied to the selector 23, and as a result, the selector 23 selects the output address of the selector 22.

The selectors 21, 22 and 23 are also controlled by a control circuit 4' to carry out an access operation as shown in FIG. 2. That is, in a read/write mode, when one of the cache memories is hit, the selector 21 selects one of the registers 5-1, 5-2, 5-3 and 5-4, the selector 22 selects the output address ASR of the selector 21, and the selector 23 selects the output address of the selector 22. Or, the selector 23 can select the external row address signal AX. Also, in a read/write mode, when the cache memories are miss-hit, the selector 23 selects the external row address signal AX. Further, in a refresh mode, the selector 22 selects the refresh address signal AR, and the selector 23 selects the output address of the selector 22.

A self-refresh operation of the device of FIG. 4 will be explained next with reference to FIGS. 6A through 6H.

At time $t_1$, when the self-refresh signal $\overline{SR}$ is changed from high to low, a self-refresh mode is established. As a result, the gate circuit 103 is opened to pass the clock signal ø1 therethrough. Also, as shown in FIG. 6G, the output signal S2 of the gate circuit 109 is changed from low to high, so that the selector 23 selects the output address of selector 22, which is in this case the refresh address signal AR.

Figure 6:
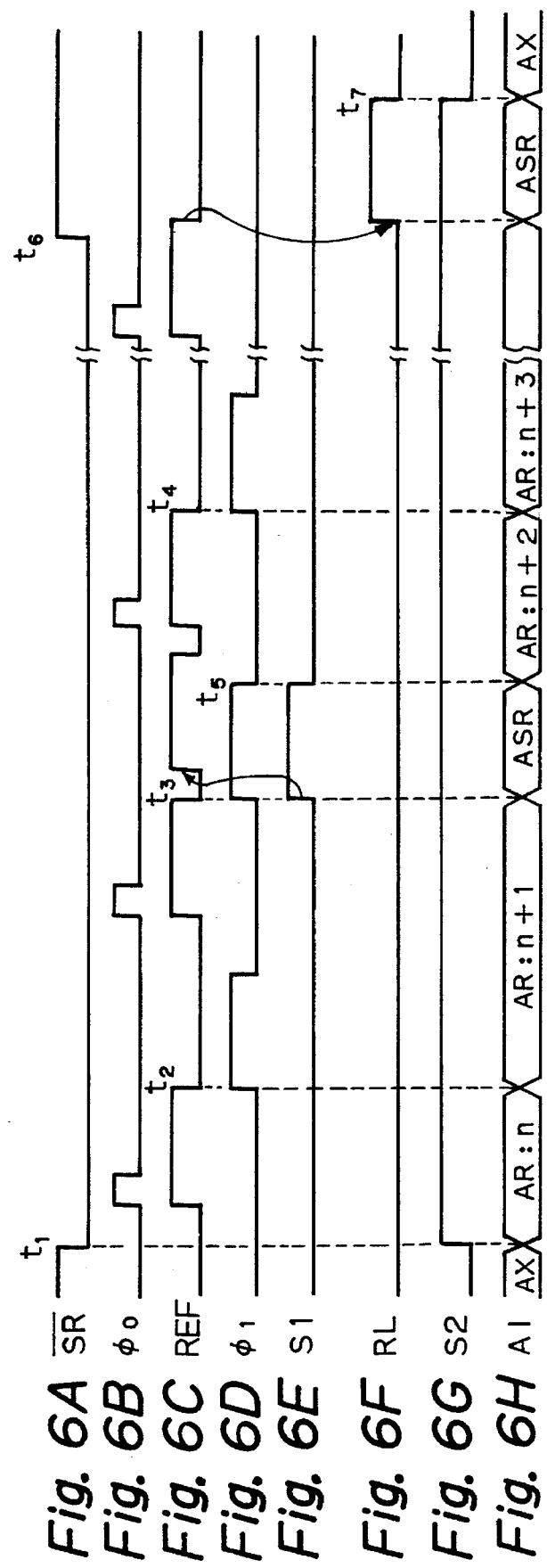
FIGS. 6A through 6H are diagrams showing the operation of the device of FIG. 4.

Since the timer signal ø0 is generated as shown in FIG. 6B, the refresh signal generating circuit 32 generates the refresh signal REF as shown in FIG. 6C, so that the clock signal generating circuit 102 generates the clock signal ø1 as shown in FIG. 6D.

At time $t_2$, $t_3$ and $t_4$, the clock signal ø1 increments the counter 33 by +1. As a result, the refresh address signal AR is incremented by +1. Simultaneously, the clock signal ø1 activates the comparator 104.

At time $t_3$, when the eight lower bits of the refresh address signal AR coincide with the content of the register 106, the comparator 104 generates the output signal S1 as shown in FIG. 6E, so that the refresh signal generating circuit 32 generates another refresh signal REF as shown in FIG. 6C. Simultaneously, the selector 22 selects the output address ASR of the selector 21. As a result, data of the memory cell blocks 11-1, 11-2, 11-3 and 11-4 is read by the cache address CA1, CA2, CA3 or CA4 designated by the two upper bits of the refresh address signal AR is read and is restored in a corresponding sense amplifier array 12-1, 12-2, 12-3 or 12-4. Then, at time $t_5$, the output signal S1 is inactive (low), the selector 22 again selects the refresh address signal AR to reinitiate a refresh operation.

Finally, at time $t_6$, the self-refresh signal $\overline{SR}$ is changed from low to high, so that the self-refresh mode is completed. In this case, the RL signal generating circuit 108 generates the RL signal as shown in FIG. 6F. As a result, the output signal S2 of the gate circuit 109 is extended until time $t_7$. Simultaneously, the selector 22 selects the output address ASR of the selector 21. As a result, data of the memory cell blocks 11-1, 11-2, 11-3 and 11-4 is read by the cache address CA1, CA2, CA3 or CA4 designated by the two upper bits of the refresh address signal AR is read and is restored in a corresponding sense amplifier array 12-1, 12-2, 12-3 or 12-4. Then, at time $t_7$, the output signal S2 is inactive (low), the selector 23 again selects the external row address signal AX.

Figure 7:
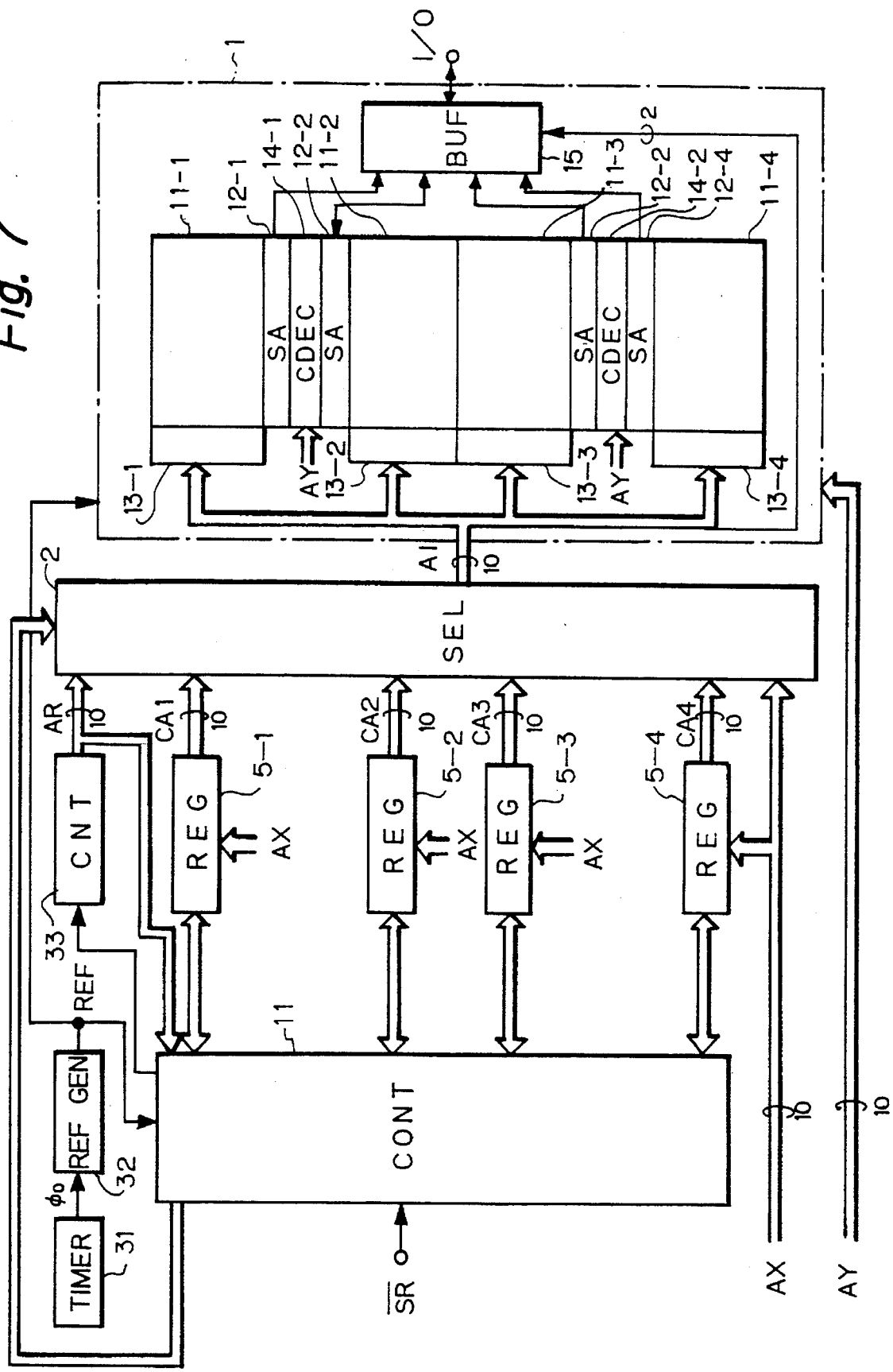
FIG. 7 is a block circuit diagram illustrating a second embodiment of the semiconductor memory device according to the present invention.

In FIG. 7, which illustrates a second embodiment of the present invention, the function of the elements 101 through 109 of FIG. 4 is introduced into a control circuit 11, and the output of the counter 33 is supplied to the control circuit 11. That is, the function of the elements 101 through 109 of FIG. 4 is carried out by firmware of the control circuit 11.

A self-refresh operation of the control circuit 4" is explained next with reference to FIG. 8.

Figure 8:
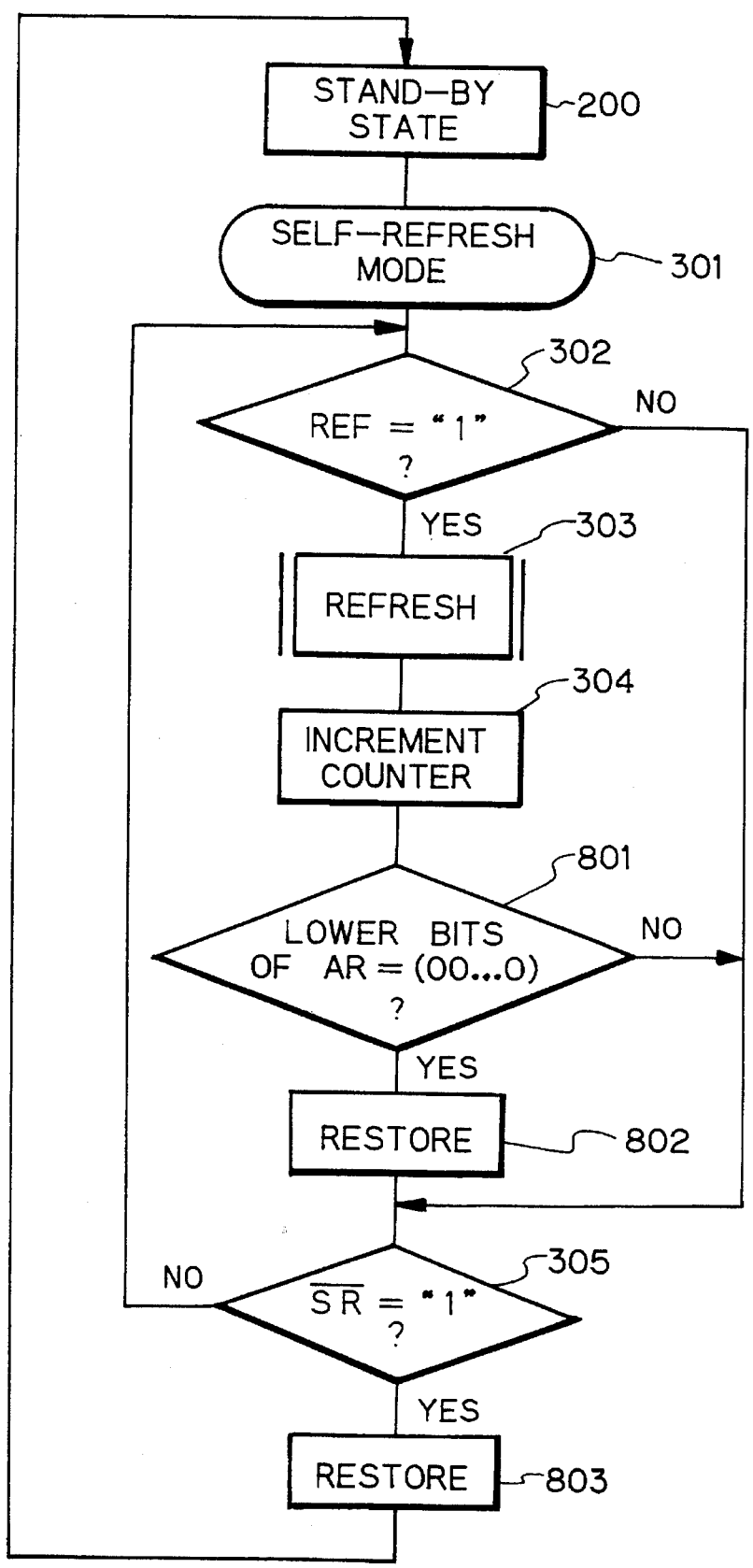
FIG. 8 is a flowchart showing the operation of the control circuit of FIG. 7.

In FIG. 8, steps 801 through 803 are added to the steps of FIG. 3. That is, the control at step 304 proceeds to step 801. At step 801, the output of the counter 33, i.e., the refresh address signal AR is read, and it is determined whether or not the eight lower bits of the refresh address signal AR is the same as a definite value such as (00000000). As a result, only when the eight lower bits of the refresh address signal AR is the same as (00000000), does the control proceed to step 802 which reads the cache address Cai in accordance with the upper two bits of the refresh address signal AR, and transmits it to the row decoders 14-1 and 14-2. As a result, the erased data of the sense amplifier array is recovered.

Also, when the self-refresh mode is completed, the control proceeds from step 305 to step 803. At step 803, the cache address CAi is read in accordance with the upper two bits of the refresh address signal AR, and is transmited to the row decoders 14-1 and 14-2. As a result, the erased data of the sense amplifier array is also recovered.

Figure 9:
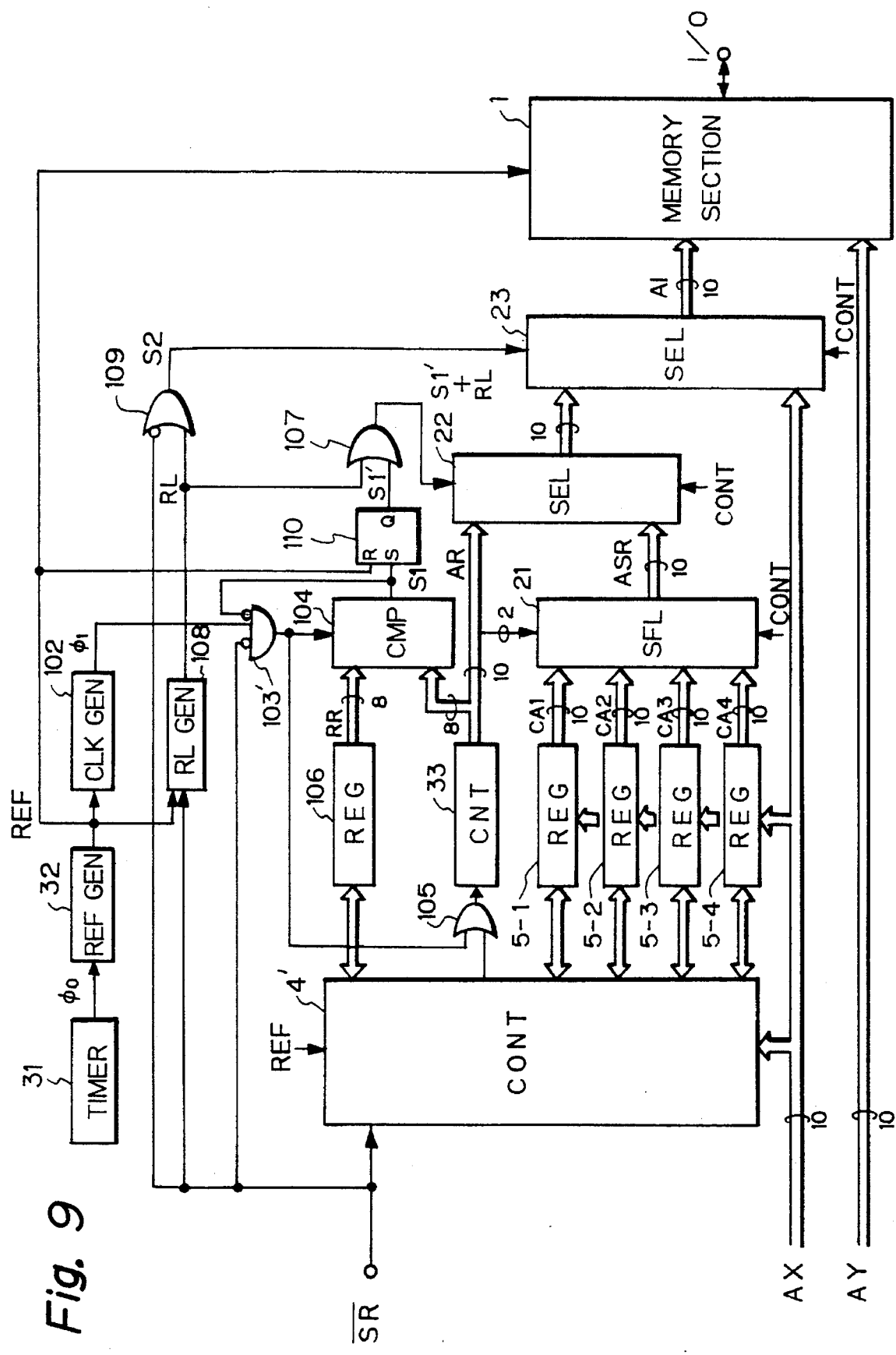
FIG. 9 is a block circuit diagram illustrating a third embodiment of the semiconductor device according to the present invention.

In FIG. 9, which illustrates a third embodiment of the present invention, the OR circuit 101 of FIG. 4 is deleted, the gate circuit 103 of FIG. 4 is modified into a gate circuit 103', and an RS filp-flop 110 is added.

A self-refresh operation of the device of FIG. 9 will be explained with reference to FIGS. 10A through 10H.

At time $t_1$, when the self-refresh signal $\overline{SR}$ is changed from high to low, a self-refresh mode is established. As a result, the gate circuit 103' is opened to pass the clock signal ø1 therethrough. Also, as shown in FIG. 10H, the output signal S2 of the gate circuit 109 is changed from low to high, so that the selector 23 selects the output address of selector 22, which is in this case the refresh address signal AR.

Since the timer signal ø0 is generated as shown in FIG. 10B, the refresh signal generating circuit 32 generates the refresh signal REF as shown in FIG. 10C, so that the clock signal generating circuit 102 generates the clock signal ø1 as shown in FIG. 10D.

At time $t_2$ and $t_4$, the clock signal ø1 passes the gate circuit 103' to increment the counter 33 by +1, so that the refresh address signal AR is incremented by +1. However, at time $t_3$, the clock signal ø1 does not pass through tile gate circuit 103', and as a result, the refresh address signal AR is not incremented. This is explained below. That is, at time $t_2$, when the eight lower bits of the refresh address signal AR coincide with the content of the register 106, the comparator 104 generates the output signal S1 as shown in FIG. 10E, so that, at time $t_3$, the clock signal ø1 does not pass through the gate circuit 103' by the output signal S1. Simultaneously, at time $t_2$', the RS flip-flop 110 is set to set its output signal S1' as shown in FIG. 10F, so that the selector 22 selects the output address ASR of the selector 21. As a result, data of the memory cell blocks 11-1, 11-2, 11-3 and 11-4 is read by the cache address CA1, CA2, CA3 or CA4 designated by the two upper bits of the refresh address signal AR is read and is restored in a corresponding sense amplifier array 12-1, 12-2, 12-3 or 12-4. Then, at time $t_3$', the SR flip-flop 110 is reset to reset its output signal S1' as shown in FIG. 10F. As a result, the output signal S1 is inactive (low), the selector 22 again selects the refresh address signal AR to reinitiate a refresh operation.

Finally, at time $t_5$, the self-refresh signal $\overline{SR}$ is changed from low to high, so that the self-refresh mode is completed. In this case, the RL signal generating circuit 108 generates the RL signal as shown in FIG. 10F. As a result, the output signal S2 of the gate circuit 109 is extended until time $t_6$. Simultaneously, the selector 22 selects the output address ASR of the selector 21. As a result, data of the memory cell blocks 11-1, 11-2, 11-3 and 11-4 is read by the cache address CA1, CA2, CA3 or CA4 designated by the two upper bits of the refresh address signal AR and is restored in a corresponding sense amplifier array 12-1, 12-2, 12-3 or 12-4. Then, at time $t_6$, the output signal S2 is inactive (low), so that the selector 23 again selects the external row address signal AX.

In the above-described embodiements, data of one of the memory cell blocks is read by using data of one of the registers and is restored in the corresponding sense amplifier array every time refresh operations for one memory cell block are completed. Further, data of one of the memory cell blocks is read by using data of only one of the registers and is restored in the corresponding sense amplifier array every time the self-refresh mode is completed.

As explained hereinbefore, according to the present invention, the performance of the dynamic semiconductor memory device associated with the sense amplifiers as cache memories can be improved without increasing the power dissipation and the time required for ending a self-refresh mode.

I claim:

1. A dynamic semiconductor memory device including a plurality of memory cell blocks associated with sense amplifiers as cache memories, and a plurality of registers for storing addresses of said memory cell blocks each indicating a content of one of said sense amplifier arrays, comprising:

means for generating a refresh address in a self-refresh mode;

means for performing a refresh operation upon said memory cell blocks by using said refresh address;

means for determining whether or not said refresh address coincides with a certain value; and means for reading first data of one of said memory cell blocks by using one of said addresses stored in said registers in accordance with said refresh address to restore said first data in one of said sense amplifier arrays in accordance with the same one of said addresses stored in said registers, when said refresh address coincides with said certain value.

2. A device as set forth in claim 1, further comprising:

means for determining whether or not said self-refresh mode is completed; and means for reading second data of one of said memory cell blocks by using one of said addresses stored in said registers in accordance with said refresh address to restore said second data in one of said sense amplifier arrays in accordance with the same one of said addresses stored in said registers, when said self-refresh mode is completed.

3. A dynamic semiconductor memory device including a plurality of memory cell blocks associated with sense amplifiers as cache memories, and a plurality of registers for storing addresses of said memory cell blocks each indicating a content of one of said sense amplifiers, comprising:

means for generating a refresh address in a self-refresh mode;

means for performing a refresh operation upon said memory cell blocks by using said refresh address;

means for determining whether or not a first part of said refresh address coincides with a certain value;

means for reading first data of one of said memory cell blocks by using one of said addresses stored in said registers designated by a second part of said refresh address to restore said first data in one of said sense amplifier arrays in accordance with said second part of said refresh address.

4. A device as set forth in claim 3, wherein said first part of said refresh address is formed by lower bits of said refresh address, and said second part of said refresh address is formed by upper bits of said refresh address.

5. A device as set forth in claim 3, further comprising:

means for determining whether or not said self-refresh mode is completed; and means for reading second data by using one of said addresses stored in said registers designated by said second part of said refresh address to restore said second data in one of said sense amplifier arrays in accordance with the same one of said addresses stored in said registers, when said self-refresh mode is completed.

6. A dynamic semiconductor memory device including a plurality of memory cell blocks associated with sense amplifiers as cache memories, and a plurality of registers for storing addresses of said memory cell blocks each indicating a content of said sense amplifiers, comprising:

means for generating a clock signal;

a counter for counting said clock signal to generate a refresh address signal;

a comparator, connected to said counter, for comparing a first part of said refresh address signal with a certain value to generate a first comparison signal when the first part of said refresh address signal is not the same as said certain value and a second comparison signal when the first part of said refresh address signal is the same as said certain value;

a first selector, connected to said registers and said counter, for selecting one of said registers in accordance with a second part of said refresh address signal;

a second selector, connected to said counter, said first selector and said comparator, for selecting said refresh address signal when said comparator generates said first comparison signal and for selecting an output of said first selector when said comparator generates said second comparison signal; and a third selector, connected to said second selector, for transmitting an output of said second selector to said memory cell blocks in a self-refresh mode and transmitting an external address signal to said memory cell blocks in a non self-refresh mode.

7. A device as set forth in claim 6, further comprising a self-refresh mode detecting circuit for detecting a completion of said self-refresh mode to generate a self-refresh mode completion signal, said second selector being further connected to said self-refresh mode detecting circuit, so that said second selector selects the output of said first selector when said second selector receives said self-refresh mode completion signal.

8. A device as set forth in claim 6, wherein said comparator is activated by said clock signal.

9. A device as set forth in claim 6, further comprising a gate circuit, connected between said clock signal generating means and said counter and being controlled by said comparator, said gate circuit prohibiting supply of said clock signal to said counter, when said second comparison signal is generated.

* * * * *

UNITED STATES PATENT AND TRADEMARK OFFICE
CERTIFICATE OF CORRECTION

PATENT NO. : 5,566,118
DATED : October 15, 1996
INVENTOR(S) : Tamio Shimizu

It is certified that error appears in the above-indentified patent and that said Letters Patent is hereby corrected as shown below:

Column 3, line 58, delete "li- 1" and insert -- 11- 1--.

Signed and Sealed this

Eleventh Day of February, 1997

Attest:

BRUCE LEHMAN

*Attesting Officer*     *Commissioner of Patents and Trademarks*